(12) United States Patent
Fujioka et al.

(10) Patent No.: US 11,664,479 B2
(45) Date of Patent: May 30, 2023

(54) LIGHT EMITTING DEVICE AND PLANAR LIGHT SOURCE

(71) Applicant: NICHIA CORPORATION, Anan (JP)

(72) Inventors: Akihiro Fujioka, Tokushima (JP); Masato Aihara, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/553,386

(22) Filed: Dec. 16, 2021

(65) Prior Publication Data

US 2022/0199867 A1 Jun. 23, 2022

(30) Foreign Application Priority Data

Dec. 17, 2020 (JP) .............................. JP2020-209055

(51) Int. Cl.
| | |
|---|---|
| *H01L 33/48* | (2010.01) |
| *H01L 33/60* | (2010.01) |
| *H01L 33/52* | (2010.01) |
| *H01L 33/50* | (2010.01) |

(52) U.S. Cl.
CPC ............ *H01L 33/483* (2013.01); *H01L 33/50* (2013.01); *H01L 33/52* (2013.01); *H01L 33/60* (2013.01)

(58) Field of Classification Search
CPC ....... H01L 33/483; H01L 33/50; H01L 33/52; H01L 33/60
See application file for complete search history.

(56) References Cited

U.S. PATENT DOCUMENTS

| | | |
|---|---|---|
| 2011/0127558 A1 | 6/2011 | Park et al. |
| 2013/0070479 A1 | 3/2013 | Ito |
| 2013/0320380 A1 | 12/2013 | Kanemaru |
| 2020/0105988 A1 | 4/2020 | Hashimoto |

FOREIGN PATENT DOCUMENTS

| | | |
|---|---|---|
| JP | 2005019838 A | 1/2005 |
| JP | 2006216821 A | 8/2006 |
| JP | 2011114341 A | 6/2011 |
| JP | 2013069423 A | 4/2013 |
| JP | 2013115280 A | 6/2013 |
| JP | 2013127994 A | 6/2013 |
| JP | 2013127995 A | 6/2013 |

(Continued)

*Primary Examiner* — Mary Ellen Bowman
(74) *Attorney, Agent, or Firm* — Global IP Counselors, LLP

(57) ABSTRACT

A light emitting device includes a light emitting element, lateral walls surrounding the light emitting element, a first light-transmissive member and a light shielding member. The lateral walls includes first to fourth lateral walls. The first and second lateral walls define a first opening therebetween. The second and third lateral walls define a second opening therebetween. The third and fourth lateral walls define a third opening therebetween. The fourth and first lateral walls define a fourth opening therebetween. In the top view, a first straight line passing through the first and third openings extends in a first direction, and a second straight line passing through the second and fourth openings extends in a second direction orthogonal to the first direction. The first light-transmissive member is arranged on or above the light emitting element and the lateral walls. The light shielding member is arranged on or above the first light-transmissive member.

14 Claims, 8 Drawing Sheets

(56) References Cited

FOREIGN PATENT DOCUMENTS

| | | | |
|---|---|---|---|
| JP | 2013127996 | A | 6/2013 |
| JP | 2013143496 | A | 7/2013 |
| JP | 2013171969 | A | 9/2013 |
| JP | 2013251393 | A | 12/2013 |
| JP | 2020053637 | A | 4/2020 |
| JP | 2020107865 | A | 7/2020 |
| WO | 2011122529 | A1 | 10/2011 |
| WO | 2011122530 | A1 | 10/2011 |
| WO | 2011122531 | A1 | 10/2011 |

LIGHT EMITTING DEVICE AND PLANAR LIGHT SOURCE

CROSS-REFERENCE TO RELATED APPLICATION

This application claims priority to Japanese Patent Application No. 2020-209055, filed on Dec. 17, 2020, the disclosure of which is hereby incorporated herein by reference in its entirety.

TECHNICAL FIELD

The present disclosure relates to a light emitting device and a light emitting module.

BACKGROUND

A light emitting device in which a reflective resin is provided on the top surface of an encapsulating resin that encapsulates a light emitting element, and that allows light from the light emitting element to exit outside from the lateral surface of the encapsulating resin having light transmissive properties is known (see Japanese Patent Publication No. 2013-115280, for example). Such a light emitting device can easily spread light in the lateral direction, and can be used as a light source for a backlight, for example.

SUMMARY

Backlights have become increasingly thinner, and the local dimming method that controls brightness of the backlight for each of a plurality of divided regions is becoming widespread. For that reason, there is demand for a light emitting device that can achieve desired light distribution characteristics to suppress brightness unevenness of a plurality of divided regions.

The purpose of an embodiment of the present invention is to provide a light emitting device that can achieve desired light distribution characteristics.

A light emitting device of an embodiment includes a light emitting element, a plurality of lateral walls surrounding the light emitting element in atop view, a first light-transmissive member and a light shielding member. The lateral walls includes a first lateral wall, a second lateral wall adjacent to the first lateral wall, a third lateral wall adjacent to the second lateral wall and facing the first lateral wall, and a fourth lateral wall adjacent to the first lateral wall and the third lateral wall, and facing the second lateral wall. The first lateral wall and the second lateral wall define a first opening therebetween. The second lateral wall and the third lateral wall define a second opening therebetween. The third lateral wall and the fourth lateral wall define a third opening therebetween. The fourth lateral wall and the first lateral wall define a fourth opening therebetween. In the top view, a first straight line passing through the first opening and the third opening extends in a first direction, and a second straight line passing through the second opening and the fourth opening extends in a second direction orthogonal to the first direction. The first light-transmissive member is arranged on or above the light emitting element and the lateral walls. The light shielding member is arranged on or above the first light-transmissive member.

According to the light emitting device of one mode for carrying out the present invention, it is possible to provide a light emitting device that can achieve desired light distribution characteristics.

DETAILED DESCRIPTION OF EMBODIMENT

Figure 1:
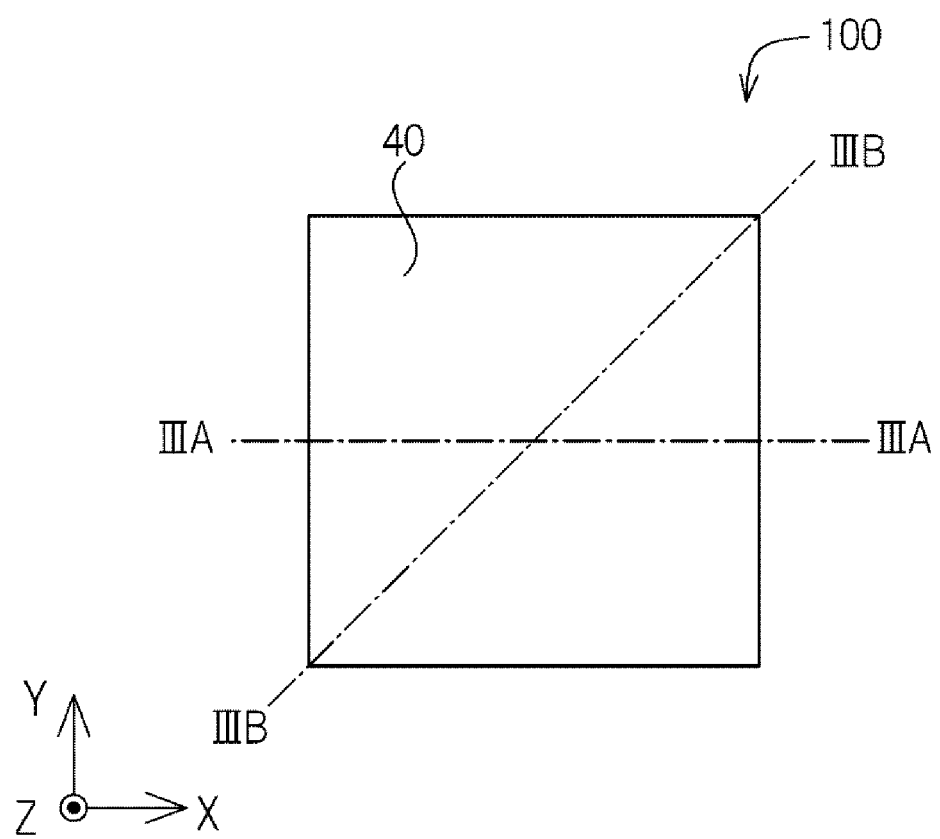
FIG. 1 is a schematic top view showing a light emitting device of the present embodiment.

Embodiments of the present disclosure will be described in detail while referring to the drawings. The embodiments below show examples, and the light emitting device and the light emitting module of the present disclosure are not limited to the embodiments below. For example, the numerical values, shapes, materials, etc., shown with the embodiments below are merely examples, and various modifications are possible provided there are no technical conflicts. The embodiments explained below are merely shown as examples, and various combinations are possible provided there are no technical conflicts.

The dimensions, shapes, etc., of constituent elements shown in the drawings may be exaggerated for ease of understanding, and may not reflect the actual dimensions, shape, and size relationship between constituent elements in the light emitting device or light emitting module. Also, to avoid the drawings becoming excessively complex, a portion of the elements may be omitted from the drawings, or as the cross section view, an end view that shows only the cut surface may be used.

In the explanation below, common reference codes are shown for constituent elements having substantially the same function, and their explanation may be omitted. Also, terminology showing a specific direction or position (e.g., "up," "down," and other terminology including or related to those terms) may be used. However, those terms are merely used to make it easier to understand the relative direction or position in the referenced drawing. Provided the relationship of the relative direction or position according to terms such as "up," "down," etc., in the referenced drawing is the same, in drawings other than of the present disclosure, actual products, etc., these do not have to use the same arrangement as the referenced drawing. Unless otherwise specified in this specification, "parallel" includes cases of two straight lines, sides, surfaces, etc., being in a range of 0° to approximately ±5°. Also, unless otherwise specified, in this specification, "orthogonal" or "perpendicular" includes cases of two straight lines, sides, surfaces, etc., being in a range of 90° to approximately ±5°. Furthermore, the positional relationship expressed as "up" and words related to "up" includes cases of being in contact, or not being in contact but being positioned above.

EMBODIMENTS

Figure 2:
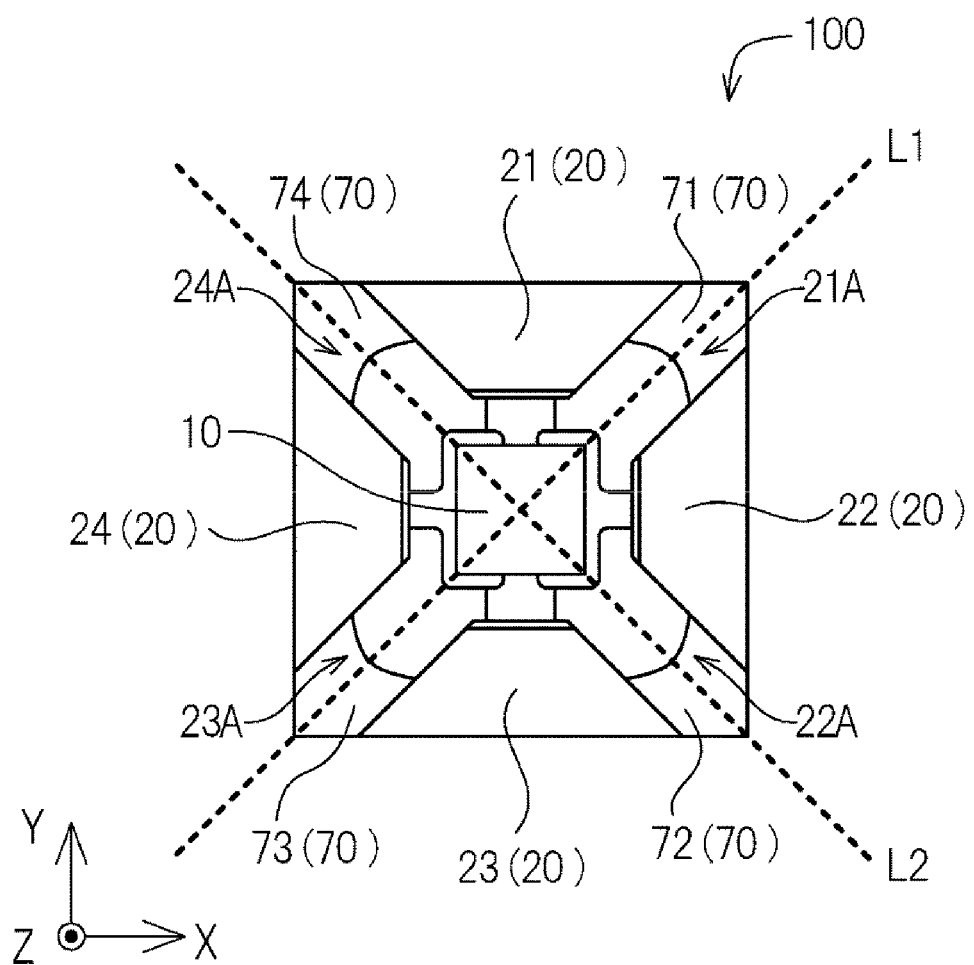
FIG. 2 is a schematic top view with a first light-transmissive member, a second light-transmissive member, and a light shielding member being omitted from the light emitting device shown in FIG. 1.

A light emitting device 100 of the present embodiment is explained while referring to FIG. 1 to FIG. 6B. The light emitting device 100 comprises alight emitting element 10, lateral walls 20, a first light-transmissive member 30, and a light shielding member 40. The light emitting device 100 may further comprise a second light-transmissive member 50 and a covering member 70. The lateral walls 20 surround the light emitting element 10 in the top view. The lateral walls 20 have a first lateral wall 21, a second lateral wall 22, a third lateral wall 23, and a fourth lateral wall 24. Furthermore, the lateral walls 20 define a first opening 21A, a second opening 22A, a third opening 23A, and a fourth opening 24A. The first opening 21A is positioned between the first lateral wall 21 and the second lateral wall 22. The second opening 22A is positioned between the second lateral wall 22 and the third lateral wall 23. The third opening 23A is positioned between the third lateral wall 23 and the fourth lateral wall 24. The fourth opening 24A is positioned between the fourth lateral wall 24 and the first lateral wall 21. In the top view, a first straight line L1 connecting (passing through) the first opening 21A and the third opening 23A extends in a first direction. The first straight line L1 is one among a plurality of straight lines connecting (passing through) the first opening 21A and the third opening 23A. In FIG. 2, the first direction crosses the X direction and the Y direction at a 45° angle. In the top view, a second straight line L2 connecting (passing through) the second opening 22A and the fourth opening 24A extends in a second direction orthogonal to the first direction. The second straight line L2 is one among a plurality of straight lines connecting (passing through) the second opening 22A and the fourth opening 24A. In FIG. 2, the second direction crosses the X direction and the Y direction at a 45° angle. The Z direction is orthogonal to the first direction and the second direction. The first light-transmissive member 30 covers the light emitting element 10 and the lateral walls 20. In other words, the first light-transmissive member 30 is arranged on or above the light emitting element 10 and the lateral walls 20. The light shielding member 40 covers the first light-transmissive member 30. In other words, the light shielding member 40 is arranged on or above the first light-transmissive member 30.

The lateral walls 20 of the light emitting device 100 have the first opening 21A, the second opening 22A, the third opening 23A, and the fourth opening 24A, so it is easier to extract light from the light emitting element 10 from the first opening 21A, the second opening 22A, the third opening 23A, and the fourth opening 24A. This makes it easier to adjust the light distribution characteristics of the light emitting device 100 to desired light distribution characteristics.

For example, when the source light irradiates a light emitting region of an approximately rectangular shape, brightness may disadvantageously decrease at the light emitting region corners, which tend to be a far distance from the light source. In order to suppress a decrease in brightness at the corners of the light emitting region, there is a demand for a light source that can achieve desired light distribution characteristics. In the top view, the first straight line L1 that connects (passes through) the first opening 21A and the third opening 23A extends in the first direction, and the second straight line L2 that connects (passes through) the second opening 22A and the fourth opening 24A extends in the second direction orthogonal to the first direction, so the light emitting device 100 easily extracts light from the light emitting element in the vicinity of the first straight line L1 and the second straight line L2. For example, by positioning the line segment of the extended first straight line L1 in the vicinity of the corners of the light emitting region, it is possible to suppress a decrease in brightness at the corners of the light emitting region. Also, by positioning the line segment of the extended second straight line L2 in the vicinity of the corners of the light emitting region, it is possible to suppress a decrease in brightness at the corners of the light emitting region.

In the light emitting device 100, the light shielding member 40 covers the top surface of the light emitting element 10 with the first light-transmissive member 30 being interposed. For this reason, light from the light emitting element 10 tends not to be emitted from the portion covered by the light shielding member 40. This makes it possible to more easily adjust the light distribution characteristics of the light emitting device 100 to desired light distribution characteristics. For example, covering the top surface of the light emitting element 10 by the light shielding member 40 can facilitate light from the light emitting element to be emitted in the lateral direction. This makes it easier for light from the light emitting element to irradiate on the corners of the light emitting region. For this reason, it is possible to suppress a decrease in brightness at the corners of the light emitting region.

Hereafter, a detailed description is given of each element constituting the light emitting device 100.
(Light Emitting Element 10)

The light emitting element 10 is a semiconductor element that emits light by itself when voltage is applied, and it is possible to use a known semiconductor element configured from a nitride semiconductor, etc. As the light emitting element, examples include an LED chip, for example. The light emitting element 10 includes semiconductor stacked bodies. The semiconductor stacked bodies include, for example, a support substrate of sapphire or gallium nitride, etc., an n-type semiconductor layer and a p-type semiconductor layer disposed on the support substrate, a light emitting layer positioned between these, and an n-side electrode and a p-side electrode respectively electrically connected to the n-type semiconductor layer and the p-type semiconductor layer. For the semiconductor stacked bodies, an item for which the support substrate is removed can also be used. Also, as the structure of the light emitting layer, it is possible to use a structure having a single active layer such as with a double hetero structure or a single quantum well structure (SQW), and also possible to use a structure having active layer groups as a unit such as with a multi quantum well structure (MQW). The light emitting layer can emit visible light or ultraviolet light. The light emitting layer can emit light in a range from blue to red light as visible light. As the semiconductor stacked body including such a light emitting layer, it is possible to include $In_xAl_yGa_{1-x-y}N$ ($0 \le x$, $0 \le y$, $x+y \le 1$). The semiconductor stacked body may include at least one light emitting layer that can emit the light emission colors described above. For example, the semiconductor stacked body may be a structure that includes one or more light emitting layers between the n-type semiconductor layer and the p-type semiconductor layer, or may be a structure in which a structure that includes the n-type semiconductor layer, the light emitting layer, and the p-type semiconductor layer in this order is repeated a plurality of times. When the semiconductor stacked body includes a plurality of light emitting layers, it is possible to include light emitting layers with different light emission colors, and possible to include light emitting layers with the same light emission color. The light emission color being the same means that the main wavelength is within ±10 nm. As combinations of the light emission color, it is possible to select as appropriate, and for example when the semiconductor stacked body includes two light emitting layers, as the combination of light emission colors, examples include blue light and blue light, green light and green light, red light and red light, ultraviolet light and ultraviolet light, blue light and green light, blue light and red light, green light and red light, etc. Also, the light emitting layer may include a plurality of active layers with different light emission colors, or may include a plurality of active layers with the same light emission color. Only a single light emitting element 10 or multiple light emitting elements 10 can be mounted in one light emitting device. In this case, to improve the luminous intensity, it is possible to combine a plurality of light emitting elements of the same light emission color. It is also possible to improve the color reproducibility by combining a plurality of light emitting elements of different light emission colors to correspond to red, green, and blue, for example. When the light emitting device comprises a plurality of light emitting elements, it is possible to have all connected in series, or connected in parallel, or to combine serial and parallel connections.

(Lateral Walls 20)

The lateral walls 20 surround the light emitting element 10 in the top view. The transmittance of the lateral walls 20 with respect to the peak wavelength of the light emitting element is lower than the transmittance of the first light-transmissive member 30 with respect to the peak wavelength of the light emitting element. By having the transmittance of the lateral walls 20 be lower, it is easier to have the light from the light emitting element 10 shielded by the lateral walls 20. This makes it easier to adjust the light distribution characteristics of the light emitting device 100 to the desired light distribution characteristics. It is also preferable that the lateral walls 20 be members having light shielding properties with respect to light from the light emitting element. This makes it easier to have light from the light emitting element 10 shielded by the lateral walls 20. Having light shielding properties in this specification means that transmittance with respect to the peak wavelength of the light emitting element is 40% or less. When the light emitting device comprises a plurality of light emitting elements, it is sufficient that the transmittance with respect to the peak wavelength of at least one light emitting element is 40% or less. The lateral walls 20 can reflect light from the light emitting element, or can absorb light from the light emitting element. The reflectivity of the lateral walls 20 with respect to the peak wavelength of the light emitting element is preferably higher than the reflectivity of the first light-transmissive member 30 with respect to the peak wavelength of the light emitting element. By working in this way, light from the light emitting element is not easily absorbed by the lateral walls, so the light extraction efficiency of the light emitting device is improved. It is also preferable that the lateral walls 20 have reflective properties. Having reflective properties in this specification means that the reflectivity with respect to the peak wavelength of the light emitting element is 60% or greater. When the light emitting device comprises a plurality of light emitting elements, it is sufficient that the reflectivity with respect to the peak wavelength of at least one light emitting element is 60% or greater.

The lateral walls 20 have the first lateral wall 21, the second lateral wall 22, the third lateral wall 23, and the fourth lateral wall 24. Furthermore, the lateral walls 20 define the first opening 21A, the second opening 22A, the third opening 23A, and the fourth opening 24A. The first opening 21A is positioned between the first lateral wall 21 and the second lateral wall 22. The second opening 22A is positioned between the second lateral wall 22 and the third lateral wall 23. The third opening 23A is positioned between the third lateral wall 23 and the fourth lateral wall 24. The fourth opening 24A is positioned between the fourth lateral wall 24 and the first lateral wall 21. In the top view, the first straight line L1 connecting (passing through) the first opening 21A and the third opening 23A extends in the first direction. In the top view, the second straight line L2 connecting (passing through) the second opening 22A and the fourth opening 24A extends in the second direction.

As shown in FIG. 2, in the top view, the outer edge of the first lateral wall 21 may extend in parallel to the X direction. The outer edge of the second lateral wall 22 may extend in parallel to the Y direction. The third lateral wall 23 faces the first lateral wall 21. The outer edge of the third lateral wall 23 may extend in parallel to the X direction. The fourth lateral wall 24 faces the second lateral wall 22. The outer edge of the fourth lateral wall 24 may also extend in parallel to the Y direction.

By the lateral walls 20 defining the first opening 21A, the second opening 22A, the third opening 23A, and the fourth opening 24A, it is easier to extract the light from the light emitting element 10 from the first opening 21A, the second opening 22A, the third opening 23A, and the fourth opening 24A. This makes it possible to adjust the light distribution characteristics of the light emitting device 100 to the desired light distribution characteristics. In the top view, the first straight line L1 connecting (passing through) the first opening 21A and the third opening 23A extends in the first direction, and in the top view, the second straight line L2 connecting (passing through) the second opening 22A and the fourth opening 24A extends in the second direction. This makes it easier for the light from the light emitting element 10 to spread in the first direction and the second direction.

(Resin Member 60)

Figure 3A:
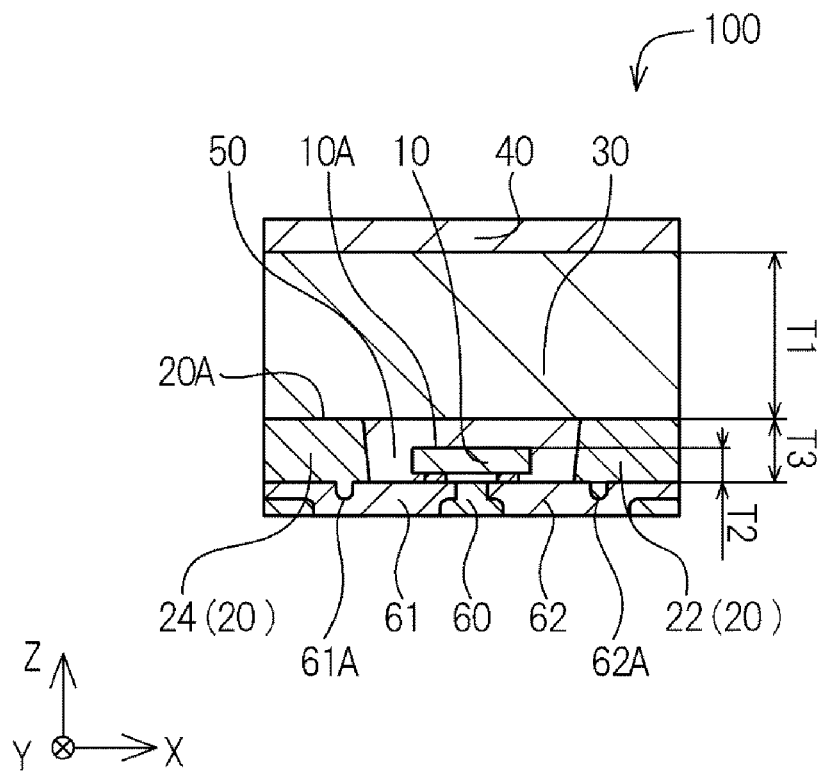
FIG. 3A is a schematic cross section diagram taken along a line IIIA-IIIA shown in FIG. 1.
Figure 3B:
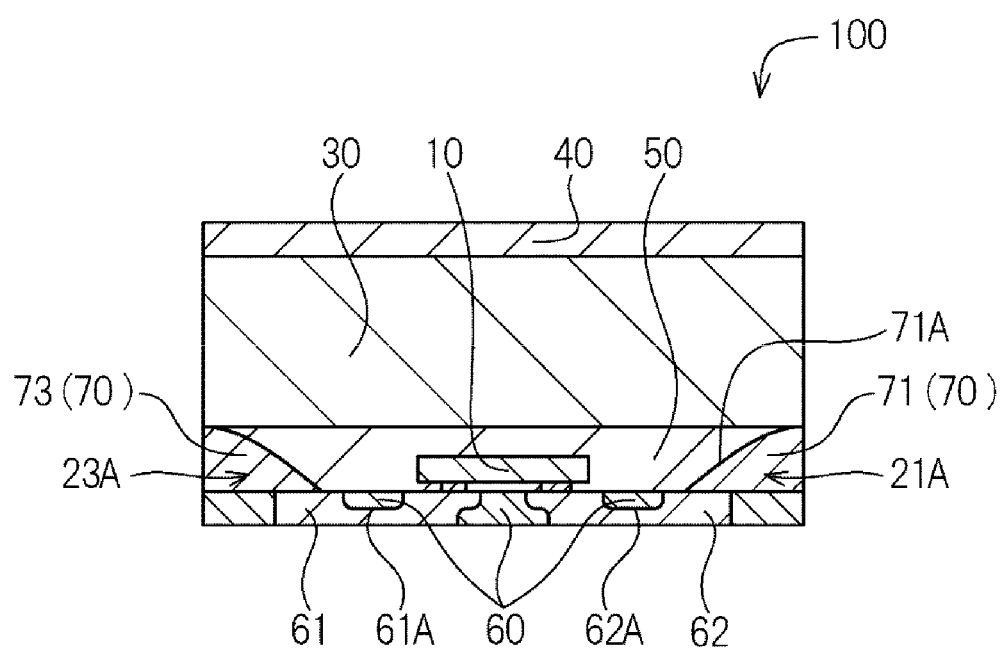
FIG. 3B is a schematic cross section diagram taken along a line IIIB-IIIB shown in FIG. 1.

As shown in FIG. 3A and FIG. 3B, the light emitting device 100 may also comprise a resin member 60, a first lead 61, and a second lead 62. The resin member 60 is a member that is positioned between the first lead 61 and the second lead 62, and that holds the first lead 61 and the second lead 62. The resin member 60 may form the lateral walls 20. When the resin member 60 forms the lateral walls 20, the lateral walls 20 constitute portions of the resin member 60 positioned above the top surface of the first lead 61 and the second lead 62. For the resin member 60, a known material such as a thermosetting resin, a thermoplastic resin, etc., can be used as the resin material. In the case of a thermoplastic resin, for example, it is possible to use polyphthalamide resin, polybutylene terephthalate (PBT), unsaturated polyester, etc. In the case of a thermosetting resin, for example, it is possible to use epoxy resin, modified epoxy resin, silicone resin, modified silicone resin, etc. As the resin material, it is particularly preferable to use a thermosetting resin such as epoxy resin, silicone resin, etc., that have good heat resistance and light resistance.

The resin member 60 preferably contains a light reflective substance in the resin material. As the light reflective substance, it is preferable to use a member for which light from the light emitting element is not easily absorbed, and for which the refractive index difference with respect to the resin material is large. Examples of such a light reflective substance include titanium oxide, zinc oxide, silicon oxide, zirconium oxide, aluminum oxide, aluminum nitride, etc. The light reflective substance can be contained at 10 weight % or greater and 90 weight % or less with respect to the resin material, for example.

(First Lead 61, Second Lead 62)

The first lead 61 and the second lead 62 are members through which the electricity is delivered to the light emitting element by electrically connecting with either the negative electrode or the positive electrode of the pair of electrodes of the light emitting element. For the first lead 61 and the second lead 62, it is possible to use a metal such as copper, aluminum, gold, silver, iron, nickel, or alloys of these, phosphor bronze, copper with iron, etc., and be formed into a predetermined shape using a process such as rolling, punching, extrusion, etching by wet or dry etching, or a combination of these. These can be a single layer or can be a layered structure. It is particularly preferable to use copper because it is inexpensive and has high heat dissipation. The first lead 61 and the second lead 62 can also, for example, have a metal plating of silver, aluminum, copper, and gold, etc., implemented on part or the full surface with a single-layer or multilayer structure for the purpose of improving reflectivity. When a metal layer that contains silver is formed on the outermost surface of the first lead 61 and the second lead 62, it is preferable to provide a protective layer such as silicon oxide, etc., on the surface of the metal layer containing silver. This makes it possible to suppress discoloration of the metal layer containing silver due to the sulfur component in the air, etc. Examples of the method for film formation of the protective layer include known methods such as a vacuum process such as sputtering, etc.

Figure 4:
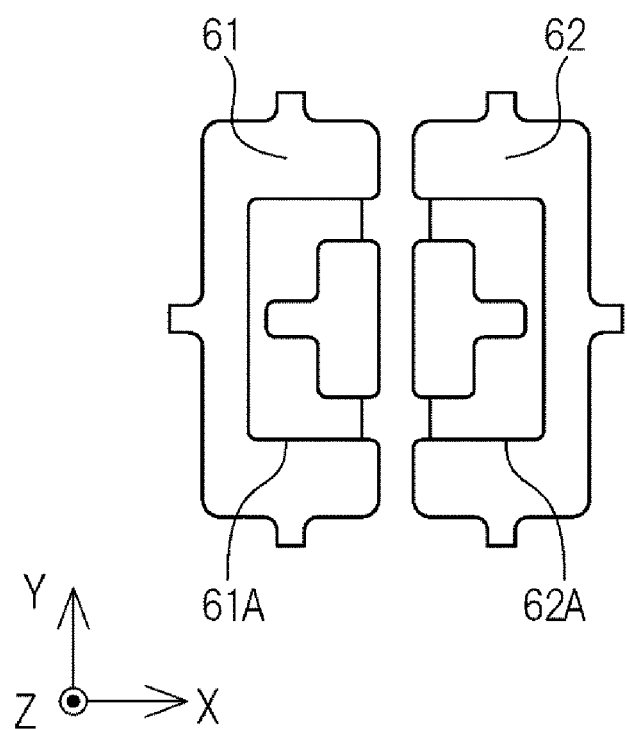
FIG. 4 is a schematic top view showing a first lead and a second lead of the present embodiment.

As shown in FIG. 3A, FIG. 3B, and FIG. 4, it is preferable for the top surface of the first lead 61 to have a first recess 61A. As shown in FIG. 3A and FIG. 3B, providing the resin member 60 positioned inside the first recess 61A can increase the area of contact by the first lead 61 and the resin member 60. This improves the adhesion of the first lead 61 and the resin member 60. Similarly, it is preferable for the top surface of the second lead 62 to have a second recess 62A.

(First Light-Transmissive Member 30)

The first light-transmissive member 30 is a member having light transmissive properties with respect to light from the light emitting element. The first light-transmissive member 30 covers the light emitting element 10 and the lateral walls 20. This makes it possible to extract light from the light emitting element 10 to outside through the first light-transmissive member 30. As shown in FIG. 3A and FIG. 3B, the first light-transmissive member 30 covers a top surface 10A of the light emitting element 10 and a top surface 20A of the lateral walls 20. The first light-transmissive member 30 may cover the top surface 10A of the light emitting element 10 via the second light-transmissive member 50, or may cover the light emitting element 10 in contact with the top surface 10A of the light emitting element 10. Having light transmissive properties in this specification means transmittance of 50% or greater with respect to the peak wavelength of the light emitting element. When the light emitting device comprises a plurality of light emitting elements, it is sufficient that the transmittance is 50% or greater with respect to the peak wavelength of at least one light emitting element.

By selecting a variety of thicknesses, etc., of the first light-transmissive member 30, it is possible to adjust the light distribution characteristics of the light emitting deice 100 to the desired light distribution characteristics. As shown in FIG. 3A, a thickness T1 of the first light-transmissive member 30 may also be thicker than a thickness T2 of the light emitting element 10. Also, the thickness T1 of the first light-transmissive member 30 may also be thicker than a thickness T3 of the lateral walls 20. The first light-transmissive member 30 having a large thickness can easily extract light of the light emitting element 10 from the first light-transmissive member 30. The thickness in this specification means the maximum value of the length of each member in the Z direction.

As the base material of the first light-transmissive member 30, it is possible to use a resin material, for example. As the resin material used for the base material of the first light-transmissive member 30, thermosetting resin is preferable. As the thermosetting resin, examples include epoxy resin, modified epoxy resin, silicone resin, modified silicone resin, acrylate resin, urethane resin, fluorine resin, etc. Among these, silicone resin and modified silicone resin are preferable because they are good in terms of heat resistance and light resistance. For example, dimethyl silicone resin can be used as the base material for the first light-transmissive member 30.

The first light-transmissive member 30 can also contain a light reflective substance. By working in this way, it is easier to adjust the light distribution characteristics of the light emitting device. As the light reflective substance, it is preferable to use a member for which light from the light emitting element is not easily absorbed, and that has a large refractive index difference with respect to the base material. Examples of this kind of light reflective substance include titanium oxide, zinc oxide, silicon oxide, zirconium oxide, aluminum oxide, aluminum nitride, etc. The first light-transmissive member 30 may also contain a wavelength conversion member. By working in this way, color adjustment of the light emitting device can become easier. The wavelength conversion member contained in the first light-transmissive member 30 can be one type or a plurality of types. It is also possible to disperse the phosphor contained in the first light-transmissive member 30, or to have local distribution. It is possible to use a known phosphor for the wavelength conversion member. Examples of the phosphor includes a fluoride-based phosphor such as a KSF-based phosphor, etc., a nitride-based phosphor such as CASN, etc., a YAG-base phosphor, a β sialon phosphor, etc. The KSF-based phosphor and CASN are examples of wavelength conversion members that convert blue light to red light, and the YAG-based phosphor is an example of a wavelength conversion member that converts blue light to yellow light. The β sialon phosphor is an example of the wavelength conversion member that converts blue light to green light. The wavelength conversion member may also be a quantum dot phosphor.

(Light Shielding Member 40)

The light shielding member 40 is a member that has light shielding properties with respect to light from the light emitting element. The light shielding member 40 covers the first light-transmissive member 30. This makes it possible to shield a portion of the light from the light emitting element 10 exiting from the first light-transmissive member 30. This makes it easier to adjust the light distribution characteristics of the light emitting device 100 to the desired light distribution characteristics. The light shielding member may reflect light from the light emitting element, or may absorb light from the light emitting element. The light shielding member preferably has reflective properties. By working in this way, light from the light emitting element is not easily absorbed by the light shielding member, so the light extraction efficiency of the light emitting device improves. The reflectivity of the light shielding member 40 with respect to the peak wavelength of the light emitting element is preferably higher than the reflectivity of the first light-transmissive member 30 with respect to the peak wavelength of the light emitting element.

As the light shielding member 40, it is possible to use metal, and it is also possible to use a resin material that contains a light reflective substance. When using a resin material as the base material of the light shielding member 40, it is possible to use the same resin material as the first light-transmissive member. Also, as the light reflective substance, similarly to the first light-transmissive member, it is possible to use titanium oxide, zinc oxide, silicon oxide, zirconium oxide, aluminum oxide, aluminum nitride, etc. The light reflective substance can be contained at 10 weight % or greater and 90 weight % or less with respect to the resin material, for example. The difference between the linear expansion coefficient of the base material of the first light-transmissive member and the linear expansion coefficient of the base material of the light shielding member is not specifically limited but is preferably 30 ppm or less. This makes it possible to suppress peeling of the first light-transmissive member 30 and the light shielding member 40. The first light-transmissive member and the light shielding member may be in contact with each other, or a known adhesive member may be positioned between the first light-transmissive member and the light shielding member. For example, when using dimethyl silicone resin as the base material of the first light-transmissive member 30, it is also possible to use dimethyl silicone resin as the base material of the light shielding member 40.

(Second Light-Transmissive Member 50)

As shown in FIG. 3A and FIG. 3B, the light emitting device 100 may also comprise the second light-transmissive member 50. The second light-transmissive member 50 includes the wavelength conversion member, and covers the lateral surface of the light emitting element. In other words, the second light-transmissive member 50 includes the wavelength conversion member, and is arranged at least in a region lateral to the lateral surface of the light emitting element. The wavelength conversion member is a member that absorbs a portion of the light from the light emitting element and converts the wavelength into a different wavelength. The second light transmissive member 50 can cover the top surface of the light emitting element. In other words, the second light-transmissive member 50 can be arranged on or above the top surface of the light emitting element. This makes it easier to convert the wavelength of the light from the light emitting element into a different wavelength. When the second light-transmissive member 50 covers the top surface of the light emitting element, the first light-transmissive member 30 covers the top surface of the light emitting element via the second light-transmissive member 50.

Having the second light-transmissive member 50 cover the light emitting element can make color adjustment of the light emitting device easier. There may be one type or a plurality of types of wavelength conversion members included in the second light-transmissive member 50. The wavelength conversion members contained in the second light-transmissive member 50 may be dispersed or may be locally distributed. It is preferable that the wavelength conversion members contained in the second light-transmissive member 50 be locally distributed to the light emitting element side. In other words, the concentration of wavelength conversion members positioned at the −Z direction side is preferably higher than the concentration of wavelength conversion members positioned at the +Z direction side. By working in this way, it is easier to have the approximately constant light passage length for which the light from the light emitting element passes through the part in which the concentration of wavelength conversion members is high, so that it is easier to suppress color unevenness of the light emitting device. For example, in the manufacturing process, by settling the wavelength conversion members within the second light-transmissive member 50, it is possible to locally distribute the wavelength conversion members to the light emitting element side. It is possible to use a known phosphor for the wavelength conversion member. When the first light-transmissive member includes the wavelength conversion members, it is preferable that the concentration of the wavelength conversion members included in the second light-transmissive member 50 be higher than the concentration of the wavelength conversion members included in the first light-transmissive member. Because the second light-transmissive member 50 is positioned closer to the light emitting element than the first light-transmissive member, making the concentration of the second light-transmissive member 50 higher can irradiate light from the light emitting element to the wavelength conversion member with good efficiency. Also, when the light emitting device 100 comprises the second light-transmissive member 50, it is also possible for the first light-transmissive member to not contain the wavelength conversion members. Allowing the first light-transmissive member not to contain the wavelength conversion member can easily make light from the light emitting element to be extracted outside from the first light-transmissive member.

As the base material of the second light-transmissive member 50, it is possible to use a resin material, for example. As the base material of the second light-transmissive member 50, it is possible to use the same resin material as the first light-transmissive member. It is preferable that the difference between the refractive index of the base material of the first light-transmissive member and the refractive index of the base material of the second light-transmissive member be 0.05 or less. By working in this way, it is possible to suppress light from the light emitting element from being reflected or refracted at the interface of the first light-transmissive member and the second light-transmissive member. As a result, it is easier to guide the light from the light emitting element from the second light-transmissive member to the first light-transmissive member, so that the light extraction efficiency of the light emitting device is improved. For example, when using dimethyl silicone resin as the base material of the first light-transmissive member 30, it is also possible to use dimethyl silicone resin as the base material of the second light-transmissive member 50.

Figure 5:
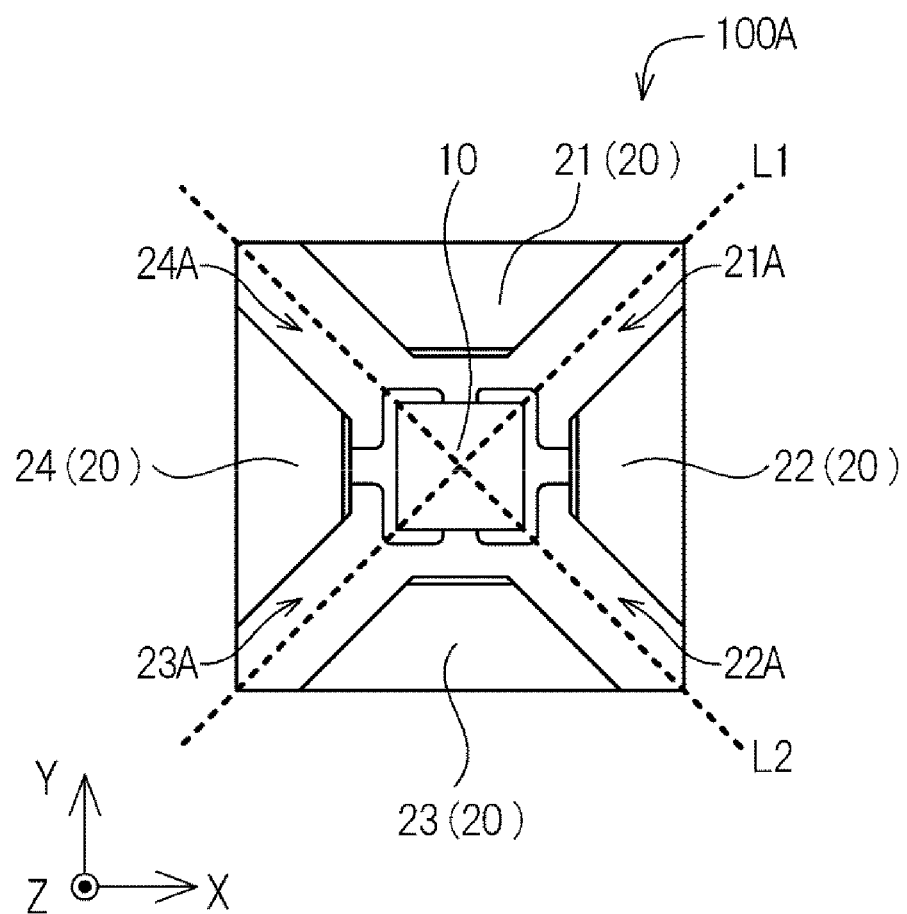
FIG. 5 is a schematic top view showing a modification example 1 of the light emitting device of the present embodiment, and is a schematic top view with the first light-transmissive member, the second light-transmissive member, and the light shielding member being omitted.
Figure 6A:
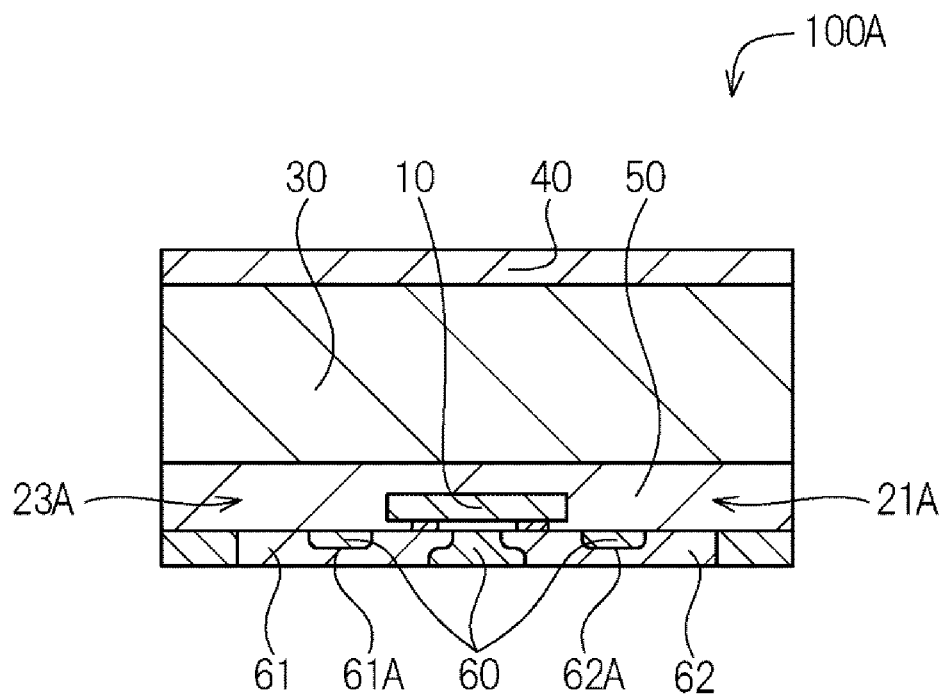
FIG. 6A is a schematic cross section diagram of the modification example 1 of the light emitting device of the present embodiment.
Figure 6B:
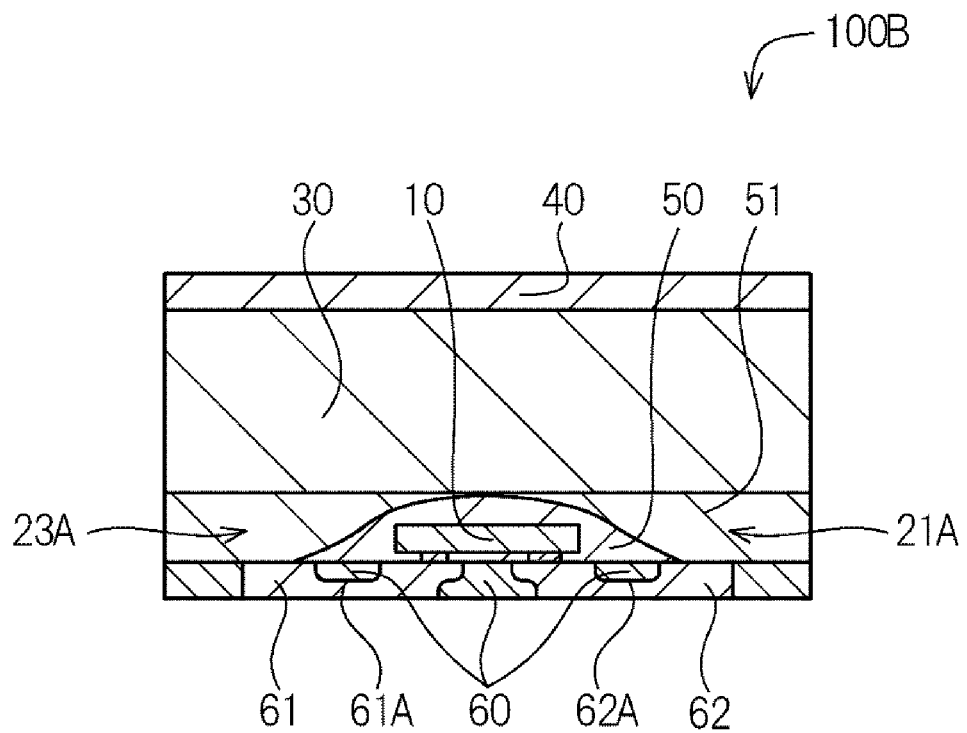
FIG. 6B is a schematic cross section diagram of a modification example 2 of the light emitting device of the present embodiment.

As shown in FIG. 5 and FIG. 6A, the second light-transmissive member 50 can be positioned up to the lateral outer edge of the light emitting device (i.e., the first to fourth openings 21A-24A are filled with the second-transmissive member 50), or as shown in FIG. 2, FIG. 3B, and FIG. 6B, the second light-transmissive member 50 can be positioned apart from the lateral outer edge of the light emitting device. It is preferable that the second light-transmissive member 50 be positioned apart from the outer edge of the light emitting device. This can lessen the difference between the length of the second light-transmissive member 50 in the first direction and the length of the second light-transmissive member 50 in the X direction, as compared to the case in which the second light transmissive member 50 is positioned up to the outer edge of the light emitting device. Accordingly, in the second light-transmissive member 50 including wavelength conversion members, the optical path length difference between the light from the light emitting element progressing in the first direction and the light from the light emitting element progressing in the X direction is reduced, so that it is easier to suppress color unevenness of the light emitting device 100. FIG. 6A is a schematic cross section diagram of the first straight line L1 of a light emitting device 100A shown in FIG. 5.

The second light-transmissive member 50 positioned apart from the outer edge of a light emitting device 100B shown in FIG. 6B can be formed by adjusting the viscosity of the unhardened second light-transmissive member 50, for example. By increasing the viscosity of the unhardened second light-transmissive member 50 to the degree that the unhardened second light-transmissive member 50 does not spread due to its wettability to the outer edge of the light emitting device 100B, it is possible to form the second light-transmissive member 50 positioned apart from the outer edge of the light emitting device 100B.

As shown in FIG. 6B, the light emitting device 100B may also comprise a third light-transmissive member 51. The third light-transmissive member 51 is positioned between the first light-transmissive member 30 and the second light-transmissive member 50 and extends through the first to fourth openings 21A-24A. In other words, the first light-transmissive member 30 covers the second light-transmissive member 50 via the third light-transmissive member 51. By the light emitting device 100B comprising the third light-transmissive member 51, it is possible to improve the mechanical strength of the light emitting device. As the material of the third light-transmissive member 51, it is possible to use the same material as that of the first light-transmissive member 30.

As shown in FIG. 2 and FIG. 3B, the light emitting device 100 may also comprise the covering member 70. The covering member 70 is a member having light transmissive properties with respect to light from the light emitting element. The transmittance of the covering member 70 with respect to the peak wavelength of the light emitting element is higher than the transmittance of the lateral walls 20 with respect to the peak wavelength of the light emitting element. The covering member 70 comprises a first covering member 71, a second covering member 72, a third covering member 73, and a fourth covering member 74. The first covering member 71 covers the first opening 21A. In other words, the first covering member 71 is arranged in the first opening 21A. The second covering member 72 covers the second opening 22A. In other words, the second covering member 72 is arranged in the second opening 22A. The third covering member 73 covers the third opening 23A. In other words, the third covering member 73 is arranged in the third opening 23A. The fourth covering member 74 covers the fourth opening 24A. In other words, the fourth covering member 74 is arranged in the fourth opening 24A. The first opening 21A, the second opening 22A, and the third opening 23A and/or the fourth opening 24A are sometimes called "the openings." By the covering member 70 covering the openings, for example, when the unhardened second light-transmissive member 50 is applied to cover the light emitting element to form the second light-transmissive member 50, the covering member 70 covering the openings can dam the unhardened second light-transmissive member 50. This makes it possible to form the second light-transmissive member 50 positioned apart from the outer edge of the light emitting device. As shown in FIG. 2, when the light emitting device 100 has a rectangular shape in the top view, the first covering member 71, the second covering member 72, the third covering member 73, and the fourth covering member 74 may also be positioned at the four corners of the light emitting device.

As the base material of the covering member 70, it is possible to use a resin material, for example. As the resin material used for the base material of the covering member 70, it is preferable to use a thermosetting resin. Examples of thermosetting resins include epoxy resin, modified epoxy resin, silicone resin, modified silicone resin, acrylate resin, urethane resin, fluorine resin, etc. Among these, silicone resin and modified silicone resin are preferable because they have good heat resistance and light resistance. The covering member 70 may also contain a light reflective substance. By working in this way, it is easier to adjust the light distribution characteristics of the light emitting device.

As shown in FIG. 3B, the first covering member 71 has a first surface 71A facing the light emitting element 10. The shape of the first surface 71A is inclined from the lower side toward the upper side so as to separate from (away from) the light emitting element 10. Also, it is preferable that the refractive index of the base material of the first covering member 71 be higher than the refractive index of the base material of the second light-transmissive member 50. When using dimethyl silicone resin as the base material of the first light-transmissive member 30, for example, it is also possible to use phenyl silicone resin as the base material of the first covering member 71. Phenyl silicone resin harder than dimethyl silicone resin can be used as the base material of the first covering member 71. This can improve the mechanical strength of the light emitting device. The second covering member 72, the third covering member 73 and/or the fourth covering member 74 may also have the same shape as the first covering member 71.

Figure 7:
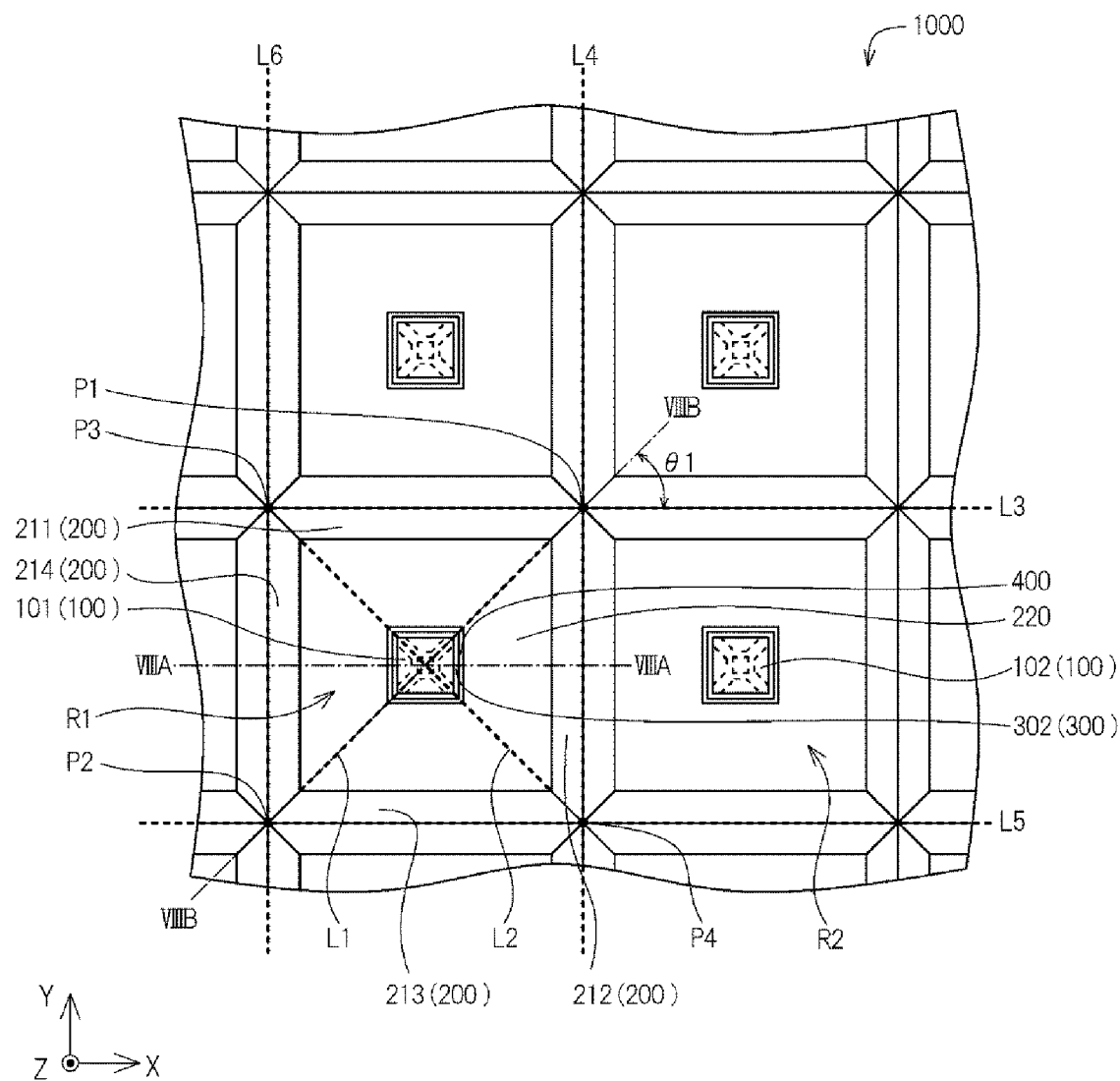
FIG. 7 is a schematic top view showing the light emitting module of the present embodiment, and is a schematic top view with an optical member being omitted.
Figure 8A:
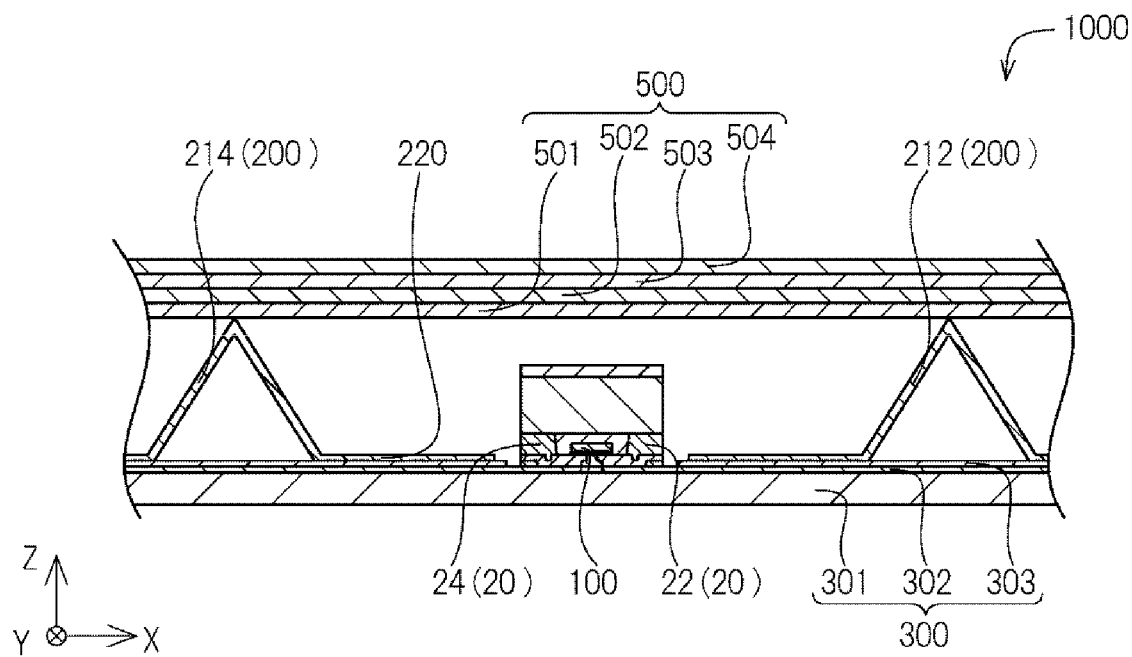
FIG. 8A is a schematic cross section diagram taken along a line VIIIA-VIIIA shown in FIG. 7.
Figure 8B:
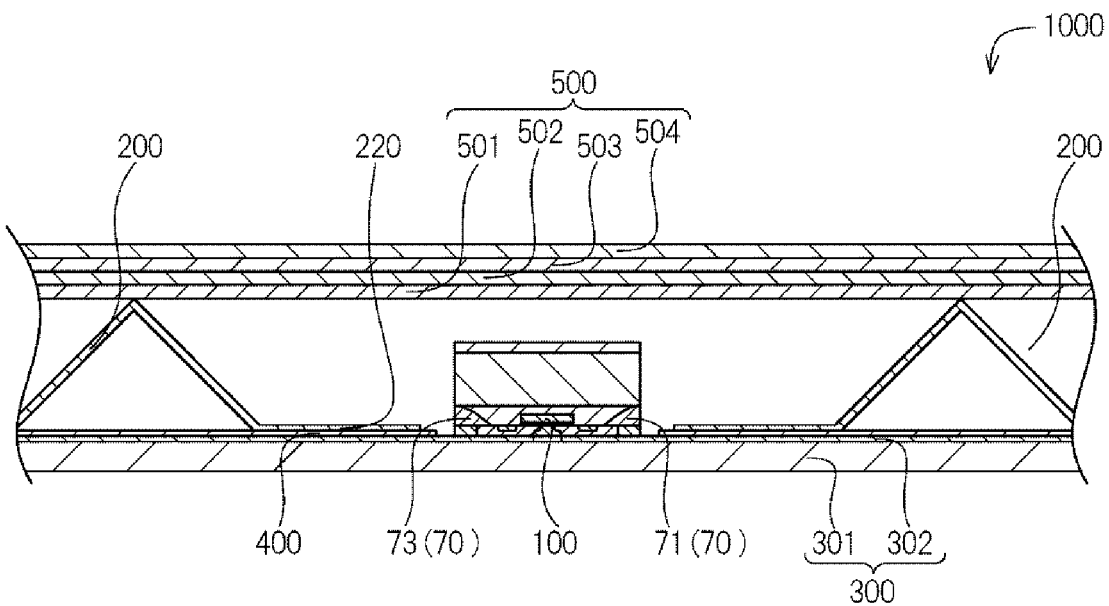
FIG. 8B is a schematic cross section diagram taken along a line VIIIB-VIIIB shown in FIG. 7.

Next, a light emitting module 1000 of the present embodiment is explained while referring to FIG. 7 to FIG. 8B. The light emitting module 1000 of the present embodiment comprises the above described light emitting device 100, and a partition member 200. The light emitting module 1000 may further comprise a wiring board 300. Following, a detailed explaining is given of each element constituting the light emitting module 1000.

(Partition Member 200)

The partition member 200 is a member that partitions the light emitting region of the light emitting module. The partition member 200 has reflectivity with respect to the light from the light emitting element. For example, by controlling the lit status of the light emitting devices for each region partitioned using the partition member 200, it is possible to have a light emitting module using the local dimming method. As shown in FIG. 7, in the top view, the partition member 200 surrounds the light emitting device 100. This makes it possible to shield the light progressing in the lateral direction from the light emitting device 100 using the partition member 200, so that it is possible to improve the contrast of each light emitting region. For example, as shown in FIG. 7, adjacent light emitting regions are regarded as a first light emitting region R1 and a second light emitting region R2, the light emitting device disposed inside the first light emitting region R1 is regarded as a first light emitting device 101, and the light emitting device disposed inside the second light emitting region R2 is regarded as a second light emitting device 102. When the first light emitting device 101 is lit and the second light emitting device 102 is not lit, the partition member 200 surrounding the first light emitting device 101 can suppress entering of the light from the first light emitting device 101 to inside the second light emitting region R2. This makes it possible to improve the contrast ratio between the first light emitting region R1 and the second light emitting region R2.

The partition member 200 may also have a first wall part 211 extending in a third direction, a second wall part 212 extending in a fourth direction orthogonal to the third direction, a third wall part 213 facing the first wall part and extending in the third direction, and a fourth wall part 214 facing the second wall part and extending in the fourth direction. In FIG. 7, the third direction is the X direction, and the fourth direction is the Y direction. The first direction which is the direction in which the first straight line L1 extends is preferably inclined at an angle of 40° or greater and 50° or less with respect to the third direction. Said another way, it is preferable that the angle θ1 formed by the first direction and the third direction be 40° or greater and 50° or less. By working in this way, because light from the light emitting device is easily emitted near the corners of the light emitting region, it is possible to thereby suppress a decrease in brightness at the corners of the light emitting region. The angle of inclination of the first direction with respect to the third direction means the acuter angle among the angles formed by the first direction and the third direction. The first direction may also be inclined at an angle of 45° with respect to the third direction. Similarly, the second direction which is the direction in which the second straight line L2 extends is preferably inclined at an angle of 40° or more and 50° or less with respect to the third direction. The second direction may also be inclined at an angle of 45° with respect to the third direction. The first wall part 211, the second wall part 212, the third wall part 213 and/or the fourth wall part 214 may also be called "wall part" or "wall parts." In this specification, the light emitting region means the region surrounded by the first wall part 211, the second wall part 212, the third wall part 213 and/or the fourth wall part 214. The light emitting region does not include the wall parts.

As shown in FIG. 7, in the top view, the third straight light L3 overlaps the first wall part 211 and extends in parallel to the third direction. Also in the top view, the fourth straight line L4 overlaps the second wall part 212 and extends in parallel to the fourth direction. The intersection point of a third straight line L3 and a fourth straight line L4 is a first intersection point P1. The intersection point P1 is preferably positioned on the first straight line L1. This makes it easier for light from the light emitting device 100 to be emitted at the corners of the light emitting region, to thereby suppress a decrease in brightness at the corners of the light emitting region. Similarly, in the top view, a fifth straight line L5 overlaps the third wall part 213 and extends in parallel to the third direction. Also in the top view, a sixth straight line L6 overlaps the fourth wall part 214 and extends in parallel to the fourth direction. The intersection point of the fifth straight line L5 and the sixth straight line L6 is a second intersection point P2, which is preferably positioned on the first straight line L1. Also, a third intersection point P3 which is the intersection point of the third straight line L3 and the sixth straight line L6 is preferably positioned on the second straight line L2. This makes it easier for light from the light emitting device to be emitted at the corners of the light emitting region. A fourth intersection point P4 that is the intersection point of the fourth straight line L4 and the fifth straight line L5 is preferably positioned on the second straight line L2.

As shown in FIG. 8A and FIG. 8B, it is preferable that a portion of the partition member 200 be positioned at a higher position than the light emitting device 100. By working in this way, it is easier to shield the light from the light emitting device 100 with the partition member 200, so it is possible to improve the contrast of each light emitting region.

As shown in FIG. 8A and FIG. 8B, the partition member 200 may also have a bottom part 220 that is in contact with the bottom ends of the wall parts. The bottom part 220 preferably covers the top surface of the wiring board 300. This makes it possible to suppress absorption of light from the light emitting element by the wiring board on which the light emitting device 100 is mounted.

The light emitting module 1000 may also comprise the wiring board 300. The wiring board 300 is a member on which the light emitting device 100 is mounted. The wiring board 300 has a base 301, and a wiring 302 provided on the base 301. The wiring board 300 may further have a light reflective insulating resin 303 that covers a portion of the wiring 302. When the wiring board 300 has a light reflective insulating resin 303, the light emitting device 100 is mounted on the wiring 302 exposed from the insulating resin 303.

The base 301 can be formed, for example, using a resin such as phenol resin, epoxy resin, polyimide resin, BT resin, polyphthalamide (PPA), polyethylene terephthalate (PET), etc., or ceramic, etc. Using resin as the material of the base 301 is advantageous in terms of inexpensiveness and ease of molding. When using resin as the material of the base 301, it is also possible to mix an inorganic filler such as glass fiber, $SiO_2$, $TiO_2$, $Al_2O_3$, etc., in the resin.

The wiring 302 is a member that is electrically connected to the light emitting device via an electrically conductive joining member, and that supplies current from outside to the light emitting device. The wiring 302 has a pattern with separation by at least two positives and negatives. The wiring 302 is formed on the surface on which the light emitting device 100 is mounted.

As the material for the wiring 302 material, examples include a metal plate such as of copper, aluminum, gold, silver, tungsten, iron, nickel, etc., and a lead frame, etc. The surface of these materials may also be further covered by a metal film. As the material of this metal film, examples include a single layer or a multi-layer structure of silver, or an alloy of silver and copper, gold, aluminum, rhodium, etc. For forming the metal film, it is possible to use a known method such as plating, sputtering, vapor deposition, etc.

The insulating resin 303 is a member for insulating the wiring 302. As the material of the insulating resin 303, examples include a resin material such as epoxy resin, silicone resin, modified silicone resin, urethane resin, oxetane resin, acrylic resin, polycarbonate resin, polyimide resin, etc. The insulating resin 303 preferably has reflective properties to suppress the light from the light emitting device being absorbed by the wiring board. For example, it is preferable to have a light reflective substance contained in the resin material.

The light emitting module 1000 may also have at least one type selected from a group consisting of a light diffusion plate, a prism sheet, and a polarizing sheet on or above the partition member 200. The light emitting module 1000 having one or more type of these optical members can further improve the uniformity of the light.

In specific terms, as shown in FIG. 8A and FIG. 8B, the light emitting module 1000 may also comprise an optical member 500 that has a light diffusion plate 501, prism sheets (first prism sheet 502 and second prism sheet 503), and a polarizing sheet 504. The optical member 500 may be in contact with the partition member 200, and may also not be in contact with the partition member 200. Having the optical member 500 and the partition member 200 be in contact can suppress light from the first light emitting device 101 from entering inside the second light emitting region R2. Also, by disposing a display panel such as a liquid crystal display panel, etc., on the optical member 500, it is possible to have a surface light emitting type light emitting device used as a light source for a direct type backlight. The stacking order of each member in the optical member 500 can be set appropriately selected.

(Light Diffusion Plate 501)

The light diffusion plate 501 is disposed above the light emitting device 100. The light diffusion plate 501 is preferably a flat shaped member, but may have recesses and projections disposed on the surface. The light diffusion plate 501 is preferably disposed substantially in parallel with respect to the wiring board 300.

The light diffusion plate 501 can be configured from a material with little light absorption in relation to visible light, such as polycarbonate resin, polystyrene resin, acrylic resin, polyethylene resin, etc. To diffuse the incident light, the light diffusion plate 501 may be provided with recesses and projections on the surface, or may have materials of different refractive indexes dispersed in the light diffusion plate 501. The recesses and projections can be of a size of 0.01 mm or greater and 0.1 mm or less, for example. As the material of a different refractive index, it is possible to use items selected from polycarbonate resin, acrylic resin, etc., for example.

The thickness and degree of light diffusion of the light diffusion plate 501 can be set as appropriate, and it is possible to use a commercially available member as a light diffusion sheet, a diffuser film, etc. For example, the thickness of the light diffusion plate 501 can be 1 mm or greater and 2 mm or less.

(First Prism Sheet 502 and Second Prism Sheet 503)

The first prism sheet 502 and the second prism sheet 503 have a shape for which a plurality of prisms extending in a predetermined direction are arrayed on the surface. For example, the first prism sheet 502 can have a plurality of prisms extending in the Y direction, and the second prism sheet 503 can have a plurality of prisms extending in the X direction. The first prism sheet 502 and the second prism sheet 503 can refract light incident from various directions in a direction toward the display panel facing the light emitting module 1000. Accordingly, light from the light emitting device 100 can be easily extracted from the light emitting surface side of the light emitting module 1000.

(Polarizing Sheet 504)

The polarizing sheet 504 can, for example, selectively transmit light in the polarization direction matching the polarization direction of the polarizing plate disposed at the backlight side of the display panel such as a liquid crystal display panel, and reflect light in the polarization direction perpendicular to the polarization direction(s) of the first prism sheet 502 and the second prism sheet 503 side. A portion of the polarization light that returns from the polarizing sheet 504 is again reflected by the first prism sheet 502, the second prism sheet 503, and the light diffusion plate 501. At this time, the polarization direction is changed, for example, converted to polarization light having the polarization direction of the polarizing plate of the liquid crystal display panel, enters again the polarizing sheet 504 to be emitted to the display panel. By doing this, it is possible to align the polarization direction light emitted from the light emitting module 1000, and efficiently emit light in the polarization direction that is effective in improving brightness of the display panel. For the polarizing sheet 504, the first prism sheet 502, and the second prism sheet 503, etc., commercially available items can be used as the optical member for a backlight.

Above, embodiments of the present invention were explained while referring to specific examples. However, the present invention is not limited to these specific examples. All modes that can be implemented with suitable changes in design by a person skilled in the art based on the embodiments described above of the present invention also belong to the scope of the present invention as long as they are included in the gist of the present invention. In addition, a person skilled in the art can come up with various modification examples and amended examples within the scope of the concept of the present invention, and those modification examples and amended examples also belong to the scope of the present invention.

What is claimed is:

1. A light emitting device comprising:
   a light emitting element;
   a plurality of lateral walls surrounding the light emitting element in a top view, each of the lateral walls having light shielding properties with respect to light emitted from the light emitting element, the lateral walls including
      a first lateral wall,
      a second lateral wall adjacent to the first lateral wall,
      a third lateral wall adjacent to the second lateral wall and facing the first lateral wall, and
      a fourth lateral wall adjacent to the first lateral wall and the third lateral wall, and facing the second lateral wall, wherein
      the first lateral wall and the second lateral wall define a first opening therebetween,
      the second lateral wall and the third lateral wall define a second opening therebetween,
      the third lateral wall and the fourth lateral wall define a third opening therebetween,
      the fourth lateral wall and the first lateral wall define a fourth opening therebetween,
      in the top view, a first straight line passing through the first opening and the third opening extends in a first direction, and a second straight line passing through the second opening and the fourth opening extends in a second direction orthogonal to the first direction;
   a first light-transmissive member arranged on or above the light emitting element and the lateral walls; and
   a light shielding member arranged on or above the first light-transmissive member.

2. The light emitting device according to claim 1, further comprising
   a second light-transmissive member arranged at least in a region lateral to a lateral surface of the light emitting element, and including a wavelength conversion member.

3. The light emitting device according to claim 2, wherein a difference between a refractive index of a base material of the first light-transmissive member and a refractive index of a base material of the second light-transmissive member is 0.05 or less.

4. The light emitting device according to claim 2, wherein the second light-transmissive member is positioned apart from a lateral outer edge of the light emitting device.

5. The light emitting device according to claim 4, further comprising
a first covering member arranged in the first opening,
a second covering member arranged in the second opening,
a third covering member arranged in the third opening, and
a fourth covering member arranged in the fourth opening.

6. The light emitting device according to claim 5, wherein the first covering member has a first surface facing the light emitting element, the first surface being inclined from a lower side toward an upper side away from the light emitting element, and
a refractive index of a base material of the first covering member is higher than a refractive index of a base material of the second light-transmissive member.

7. The light emitting device according to claim 1, wherein a difference between a linear expansion coefficient of a base material of the first light-transmissive member and a linear expansion coefficient of a base material of the light shielding member is 30 ppm or less.

8. A light emitting module comprising:
a light emitting device including
  a light emitting element,
  a plurality of lateral walls surrounding the light emitting element in a top view, the lateral walls including a first lateral wall, a second lateral wall adjacent to the first lateral wall, a third lateral wall adjacent to the second lateral wall and facing the first lateral wall, and a fourth lateral wall adjacent to the first lateral wall and the third lateral wall, and facing the second lateral wall, wherein the first lateral wall and the second lateral wall define a first opening therebetween, the second lateral wall and the third lateral wall define a second opening therebetween, the third lateral wall and the fourth lateral wall define a third opening therebetween, the fourth lateral wall and the first lateral wall define a fourth opening therebetween, in the top view, a first straight line passing through the first opening and the third opening extends in a first direction, and a second straight line passing through the second opening and the fourth opening extends in a second direction orthogonal to the first direction,
  a first light-transmissive member arranged on or above the light emitting element and the lateral walls, and
  a light shielding member arranged on or above the first light-transmissive member;
a partition member surrounding the light emitting device in the top view, the partition member including
  a first wall part extending in a third direction,
  a second wall part extending in a fourth direction orthogonal to the third direction,
  a third wall part facing the first wall part and extending in the third direction, and
  a fourth wall part facing the second wall part and extending in the fourth direction, wherein
the light emitting device is arranged with respect to the partition member so that the first direction is inclined at an angle of 40° or greater and 50° or less with respect to the third direction in the top view.

9. The light emitting module according to claim 8, wherein
the first direction is inclined at 45° with respect to the third direction.

10. The light emitting module according to claim 8, wherein
in the top view,
a third straight line overlaps the first wall part and extends in parallel to the third direction,
a fourth straight line overlaps the second wall part and extends in parallel to the fourth direction, and
an intersection point between the third straight line and the fourth straight line is positioned on the first straight line.

11. The light emitting module according to claim 10, wherein
in the top view,
a fifth straight line overlaps the third wall part and extends in parallel to the third direction,
an intersection point between the fourth straight line and the fifth straight line is positioned on the second straight line.

12. The light emitting device according to claim 1, wherein
transmittance of each of the lateral walls with respect to a peak wavelength of the light emitting element is 40% or less.

13. The light emitting device according to claim 1, wherein
reflectivity of each of the lateral walls with respect to a peak wavelength of the light emitting element is 60% or greater.

14. The light emitting device according to claim 1, wherein
each of the first lateral wall, the second lateral wall, the third lateral wall and the fourth lateral wall includes a surface extending parallel to the first straight line and a surface extending parallel to the second straight line.

* * * * *